United States Patent
Zhang et al.

(10) Patent No.: US 10,451,939 B2
(45) Date of Patent: Oct. 22, 2019

(54) ARRAY SUBSTRATE, DISPLAY DEVICE HAVING THE SAME, AND MANUFACTURING METHOD THEREOF

(71) Applicant: BOE TECHNOLOGY GROUP CO., LTD., Beijing (CN)

(72) Inventors: Dacheng Zhang, Beijing (CN); Wenchu Dong, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 9 days.

(21) Appl. No.: 15/107,089

(22) PCT Filed: Dec. 28, 2015

(86) PCT No.: PCT/CN2015/099237
§ 371 (c)(1),
(2) Date: Jun. 21, 2016

(87) PCT Pub. No.: WO2016/184113
PCT Pub. Date: Nov. 24, 2016

(65) Prior Publication Data
US 2017/0115541 A1  Apr. 27, 2017

(30) Foreign Application Priority Data

May 18, 2015 (CN) .......................... 2015 1 0254643

(51) Int. Cl.
*G02F 1/1362* (2006.01)
*H01G 9/00* (2006.01)
(Continued)

(52) U.S. Cl.
CPC ...... *G02F 1/136213* (2013.01); *G02F 1/1368* (2013.01); *G09G 3/3685* (2013.01);
(Continued)

(58) Field of Classification Search
CPC .................................................. H01L 27/1255
See application file for complete search history.

(56) References Cited

U.S. PATENT DOCUMENTS 6,018,377 A * 1/2000 Kim .................. G02F 1/136213
349/138
2005/0001967 A1* 1/2005 Chae ..................... G02F 1/1362
349/139
(Continued)

FOREIGN PATENT DOCUMENTS

CN         1983606 A    6/2007
CN       101957525 A    1/2011
(Continued)

OTHER PUBLICATIONS

X. Yang et al., "A high-performance all-solid-state supercapacitor with graphene-doped carbon material electrodes and a graphene oxide-doped ion gel electrolyte," Carbon 72 (2014) 381-386. (Year: 2014).*

(Continued)

*Primary Examiner* — Meiya Li
*Assistant Examiner* — Peter M Albrecht
(74) *Attorney, Agent, or Firm* — Intellectual Valley Law, P.C.

(57) ABSTRACT

The present application discloses an array substrate. The array substrate includes a liquid crystal capacitor; and a storage capacitor having a first electrode, a second electrode, and an electrolyte layer sandwiched by the first electrode and the second electrode. The storage capacitor is an electrochemical capacitor coupled in parallel with the liquid crystal capacitor.

15 Claims, 5 Drawing Sheets

(51) Int. Cl.
*G02F 1/1368* (2006.01)
*G09G 3/36* (2006.01)
*H01G 9/022* (2006.01)
*H01G 9/042* (2006.01)
*H01L 27/12* (2006.01)
*H01L 49/02* (2006.01)

(52) U.S. Cl.
CPC ............... *H01G 9/00* (2013.01); *H01G 9/022* (2013.01); *H01G 9/042* (2013.01); *H01L 27/1255* (2013.01); *H01L 27/1259* (2013.01); *H01L 28/60* (2013.01); *G09G 2300/0426* (2013.01)

(56) References Cited

U.S. PATENT DOCUMENTS

| | | | | |
|---|---|---|---|---|
| 2007/0000775 | A1* | 1/2007 | Nakahara | H01G 9/08 204/297.01 |
| 2007/0058101 | A1* | 3/2007 | Kawasaki | G02F 1/133784 349/43 |
| 2007/0291204 | A1* | 12/2007 | Otake | G02F 1/133555 349/114 |
| 2009/0085855 | A1* | 4/2009 | Hsu | G09G 3/3655 345/94 |
| 2010/0020255 | A1* | 1/2010 | Chen | G02F 1/13439 349/38 |
| 2010/0091431 | A1* | 4/2010 | Ito | H01G 9/022 361/504 |
| 2011/0115006 | A1* | 5/2011 | Sato | H01L 27/1237 257/296 |
| 2013/0168657 | A1* | 7/2013 | Choong | H01L 51/0097 257/40 |
| 2015/0270324 | A1* | 9/2015 | Yoneya | H01L 51/0533 257/40 |

FOREIGN PATENT DOCUMENTS

| | | | |
|---|---|---|---|
| CN | 102290398 | A | 12/2011 |
| CN | 102667985 | A | 9/2012 |
| CN | 104538202 | A | 4/2015 |
| CN | 104808409 | A | 7/2015 |
| JP | 0580356 | A * | 4/1993 |
| JP | 2009210681 | A | 9/2009 |

OTHER PUBLICATIONS

International Search Report & Written Opinion dated Apr. 5, 2016 regarding PCT/CN2015/099237.
Second Office Action in the Chinese Patent Application No. 201510254643.3, dated Nov. 15, 2017; English translation attached.

* cited by examiner

ARRAY SUBSTRATE, DISPLAY DEVICE HAVING THE SAME, AND MANUFACTURING METHOD THEREOF

CROSS-REFERENCE TO RELATED APPLICATION

This application is a national stage application under 35 U.S.C. § 371 of International Application No. PCT/CN2015/099237 filed Dec. 28, 2015, which claims priority to Chinese Patent Application No. 201510254643.3, filed May 18, 2015, the contents of which are incorporated by reference in the entirety.

FIELD

The present invention relates to display technology, more particularly, to an array substrate, a display device having the same, and a manufacturing method thereof.

BACKGROUND

Thin film transistor liquid crystal display (TFT-LCD) devices have dominated the current flat-panel display market due to its advantages of small size, low power consumption, non-radiation, and so on.

In one common type of TFT-LCD devices, a signal voltage is applied to liquid crystal pixel to rotate the liquid crystal molecules, and a storage capacitor is electrically connected in parallel with the liquid crystal pixel. When the TFT is turned on or off, a feed-through voltage occurs in the pixel electrode, resulting in adverse effects on display quality. The larger the storage capacitor, the smaller the feed-through voltage effects. The capacitance of the storage capacitor may be increased by increasing the electrode areas of the storage capacitor.

SUMMARY

In one aspect, the present disclosure provides an array substrate comprising a liquid crystal capacitor; and a storage capacitor comprising a first electrode, a second electrode, and an electrolyte layer sandwiched by the first electrode and the second electrode. The storage capacitor is an electrochemical capacitor coupled in parallel with the liquid crystal capacitor.

Optionally, the array substrate further comprises a gate electrode in a same layer as the first electrode.

Optionally, the array substrate further comprises a gate insulating layer in a same layer as the electrolyte layer.

Optionally, the array substrate further comprises a gate insulating layer on a side of the first electrode distal to the electrolyte layer.

Optionally, the array substrate further comprises a pixel electrode electrically connected to the second electrode.

Optionally, the second electrode is a pixel electrode.

Optionally, the electrolyte layer is a polymer electrolyte layer.

Optionally, the first electrode is made of one or more materials selected from a group consisting of carbon materials, metal oxides, and conductive polymers.

Optionally, the second electrode is made of one or more materials selected from a group consisting of carbon materials, metal oxides, and conductive polymers.

Optionally, the liquid crystal capacitor comprises a pixel electrode, a common electrode, and a liquid crystal layer.

Optionally, the electrolyte layer has a thickness in the range of about 2 nm to about 5000 nm.

In another aspect, the present disclosure provides a method of manufacturing an array substrate, comprising forming a liquid crystal capacitor and forming a storage capacitor on a base substrate. The storage capacitor is an electrochemical capacitor coupled in parallel with the liquid crystal capacitor.

Optionally, forming a storage capacitor on a base substrate comprises forming a first electrode; forming a second electrode; and forming an electrolyte layer sandwiched by the first electrode and the second electrode.

Optionally, the method further comprises forming a gate electrode on the base substrate; and forming a gate insulating layer on a side of the gate electrode distal to the base substrate.

Optionally, the gate electrode and the first electrode are formed in a single process.

Optionally, the gate insulating layer is in a same layer as the electrolyte layer.

Optionally, the first electrode is formed on a side of the gate insulating layer distal to the base substrate.

Optionally, the second electrode is the pixel electrode.

Optionally, the method further comprises forming a pixel electrode on the base substrate; and connecting the pixel electrode to the second electrode.

Optionally, the electrolyte layer is a polymer electrolyte layer.

Optionally, the first electrode is made of one or more materials selected from a group consisting of carbon materials, metal oxides, and conductive polymers.

Optionally, the second electrode is made of one or more materials selected from a group consisting of carbon materials, metal oxides, and conductive polymers.

Optionally, the step of forming a liquid crystal capacitor comprises forming a pixel electrode, forming a common electrode, and forming a liquid crystal layer.

Optionally, the electrolyte layer has a thickness in the range of about 2 nm to about 5000 nm.

In another aspect, the present disclosure provides a display device comprising the array substrate described herein or manufactured by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In conventional TFT-LCD devices, adverse effects of feed-through voltage can be reduced by increasing electrode area of a storage capacitor. However, the electrodes are typically made of non-transparent material. A larger electrode area results in a reduced aperture ratio and affects display quality.

The present disclosure provides an array substrate with superior electronic properties, having minimized feed-through voltage effects without reducing aperture ratio of the array substrate. In some embodiments, the array substrate includes a liquid crystal capacitor and a storage capacitor, e.g., a storage capacitor includes a first electrode, a second electrode, and an electrolyte layer sandwiched by the first electrode and the second electrode. In some embodiments, the storage capacitor is coupled in parallel with the liquid crystal capacitor. The liquid crystal capacitor may include, for example, a pixel electrode and a common electrode as two electrodes, and a liquid crystal layer as a dielectric material. The array substrate may further include a thin film transistor having a gate electrode, a source electrode, and a drain electrode. The liquid crystal capacitor may be connected to the thin film transistor. For example, the pixel electrode of the liquid crystal capacitor is connected to the drain electrode of the thin film transistor. In some embodiments, the second electrode of the storage capacitor is connected to the pixel electrode of the liquid crystal capacitor, and in turn connected to the drain electrode of the thin film transistor. Optionally, the pixel electrode of the liquid crystal capacitor may be used as the second electrode of the storage capacitor. Optionally, the first electrode of the storage capacitor receives a common voltage when the array substrate is in operation.

Figure 1A:
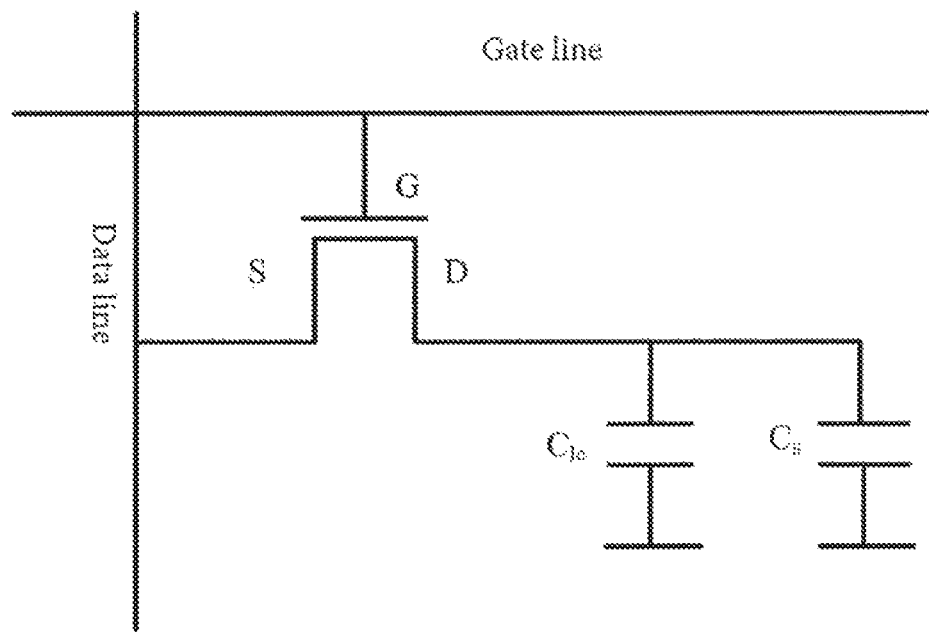
FIG. 1A is a diagram illustrating a thin film transistor.

FIG. 1A is a diagram illustrating a thin film transistor. Referring to FIG. 1A, the TFT includes a gate electrode G, a source electrode S, and a drain electrode D. A gate line connects gate electrodes G in all TFTs in a same row, and a data line connects source electrode S in all TFT's in a same row. When the TFT is turned on, a data signal is transmitted through the data line to the TFT, a signal voltage is then applied to liquid crystal pixel having a liquid crystal capacitance $C_{lc}$. Typically, the liquid crystal capacitance $C_{lc}$ has a relatively small value, which is not sufficient for maintaining the voltage until next time when the TFT is turned on. Thus, a storage capacitor electrically connected in parallel to the liquid crystal is typically required for maintaining the voltage. When the TFT is switch between on and off states, a feed-through voltage occurs in the pixel electrode, resulting in adverse effects on display quality such as flicker, trailing, and disruption on gray-scale. The feed-through voltage $\delta V$ can be calculated by the following equation:

$$\delta V = \frac{C_{gs}}{C_{gs} + C_{lc} + C_s + C_\varepsilon} V_{pp}$$

wherein $C_{gs}$ parasitic capacitance, $C_e$ is gate electrode capacitance, $V_{pp}$ is a voltage on the pixel electrode. According to the equation, the storage capacitance $C_s$ has the dominant effects on the feed-through voltage. In some embodiments, the feed-through voltage can be reduced by increasing the storage capacitance.

Figure 1B:
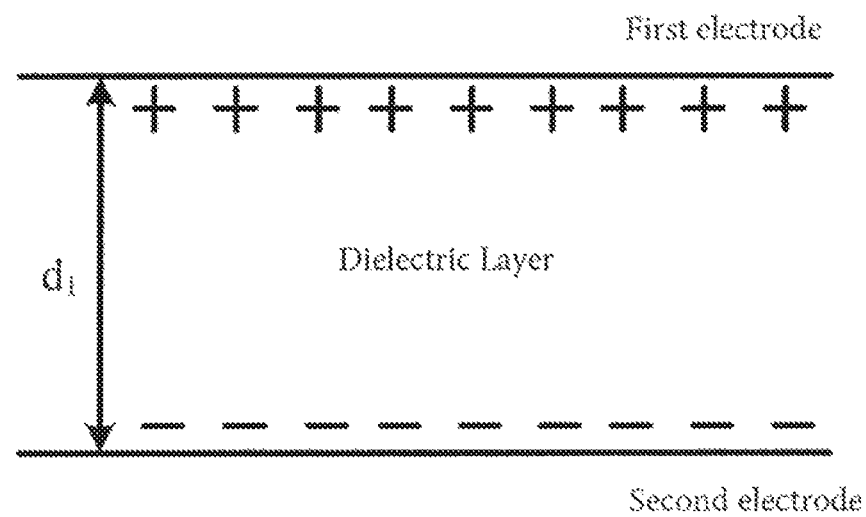
FIG. 1B is a diagram illustrating the structure of a conventional capacitor.

FIG. 1B is a diagram illustrating the structure of a conventional capacitor. Referring to FIG. 1B, the capacitor includes two electrodes and a dielectric layer between the two electrodes. The capacitance of a conventional capacitor can be expressed as $C=\varepsilon S/d_1$, wherein $\varepsilon$ is the dielectric constant of the dielectric layer, S is the area of the electrodes, and $d_1$ the distance between two electrodes. Thus, the capacitance of the conventional storage capacitor may be increased by increasing the electrode areas of the storage capacitor. However, the electrodes are typically made of non-transparent material. A larger electrode area results in a reduced aperture ratio and affects display quality.

A supercapacitor, also known as an electrochemical capacitor (EC), is a novel energy storage device having characteristics of both a secondary battery and a conventional capacitor. That is, it has the high power characteristics of a conventional capacitor, and the high specific energy density characteristics of a battery. The supercapacitor polarizes an electrolytic solution to store energy electrostatically. Because the mechanism is reversible, the supercapacitor can be charged and discharged many times. In some embodiments, the supercapacitor is an electrochemical capacitor that exhibits the electric double layer effect.

Figure 1C:
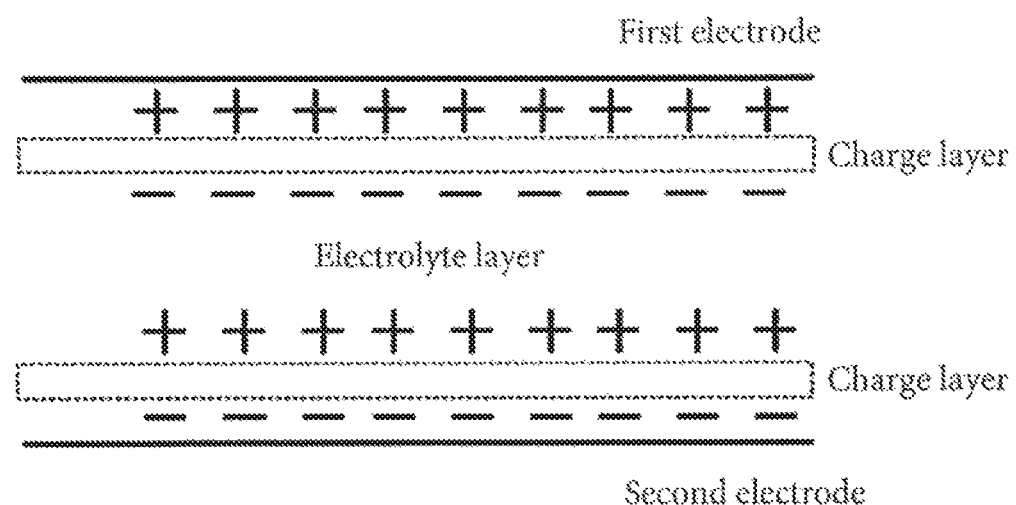
FIG. 1C Is a diagram illustrating the structure of a storage capacitor in some embodiments.

FIG. 1C is a diagram illustrating the structure of a supercapacitor in some embodiments. Referring to FIG. 1C, the capacitor in the embodiment has two electrodes and an electrolyte layer sandwiched by the two electrodes. Two very thin charge layers (Helmholtz double layer) form on two interfaces between two electrodes and the electrolyte layer. The thin charge layer has a structure similar to that of a parallel plate capacitor. The capacitance of a supercapacitor can be calculated using the equation $C=\varepsilon S/d_2$, wherein $\varepsilon$ is the dielectric constant of the electrolyte layer, S is the area of the electrodes, and $d_2$ is the distance of the thin charge layer. Because $d_2$ is of a very small value, the capacitance of the supercapacitor is much larger than a conventional capacitor having a same electrode area.

Figure 2:
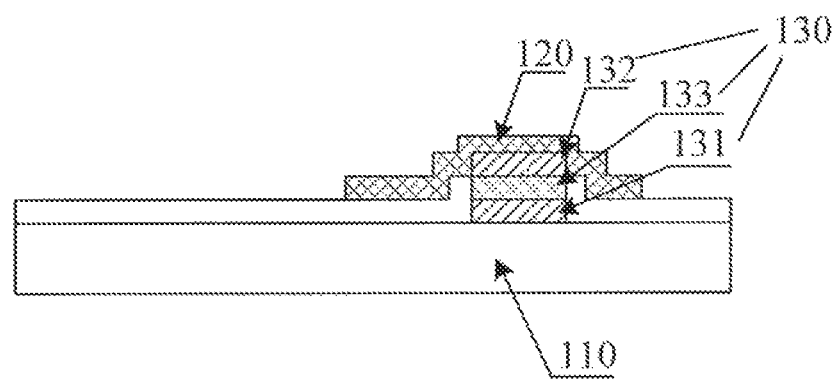
FIG. 2 is a diagram illustrating me structure of an array substrate in some embodiments.

FIG. 2 is a diagram illustrating the structure of an array substrate in some embodiments. Referring to FIG. 2, the array substrate in the embodiment includes a base substrate 110 and a storage capacitor 130 on the base substrate. The storage capacitor 130 is a supercapacitor, having a first electrode 131, a second electrode 132, and an electrolyte layer 133 sandwiched by the first electrode 131 and the second electrode 132. The array substrate further includes a pixel electrode 120 on a side of the second electrode 132 distal to the base substrate 110. Optionally, the electrolyte layer has a thickness in the range of about 2 nm to about 5000 nm, e.g., about 2 nm to about 300 nm, about 2 nm to about 500 nm, about 2 nm to about 700 nm, about 2 nm to about 1000 nm, about 2 nm to about 2000 nm, about 2 nm to about 3000 nm, or about 2 nm to about 4000 nm.

By using a supercapacitor in the array substrate, a same storage capacitance can be achieved using a smaller capacitor area as compared to a conventional capacitor. Similarly, a much larger capacitance can be obtained by using an electrode area substantially the same as that of a conventional capacitor. Accordingly, the present disclosure provides an array substrate having minimized feed-through voltage effects without compromising aperture ratio of the array substrate.

Figure 3:
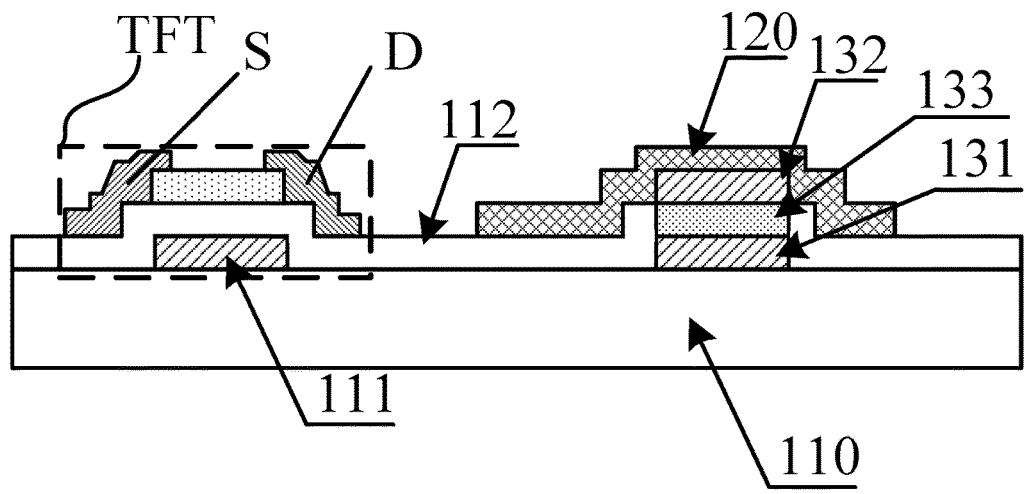
FIG. 3 is a diagram illustrating the structure of an array substrate in some embodiments.

FIG. 3 is a diagram illustrating the structure of an array substrate in some embodiments. Referring to FIG. 3, the array substrate in the embodiment includes a thin film transistor TFT having a gate electrode 111, a source electrode S, and a drain electrode D. The gate electrode 111 is in a same layer as the first electrode 131. For example, the gate electrode 111 and the first electrode 131 may be formed in a same process (e.g., a single patterning process). Optionally, the gate electrode 111 and the first electrode 131 can be made of a same material and formed in a single process.

The array substrate in the embodiment further includes a gate insulating layer 112 on a side of the gate electrode 111 distal to the base substrate 110. The gate insulating layer 112 is in a same layer as the electrolyte layer 133. The second electrode 132 is on a side of the electrolyte layer 133 distal to the base substrate 110. The second electrode 132 is electrically connected to a pixel electrode 120, which is on a side of the second electrode 132 distal to the base substrate 110.

Optionally, the first electrode 131 and/or the second electrode 132 is made of one or more materials selected from a group consisting of carbon materials, metal oxides, and conductive polymers. Examples of carbon materials include, but are not limited to, carbon nanotubes, active carbon, and grapheme. Examples of metal oxides include, but are not limited to, manganese dioxide, ruthenium dioxide, nickel cobalt oxide, and nickel cobalt hydroxide. Examples of conductive polymer include, but are not limited to, polyaniline, polythiphene, and polypyrrole.

Figure 4:
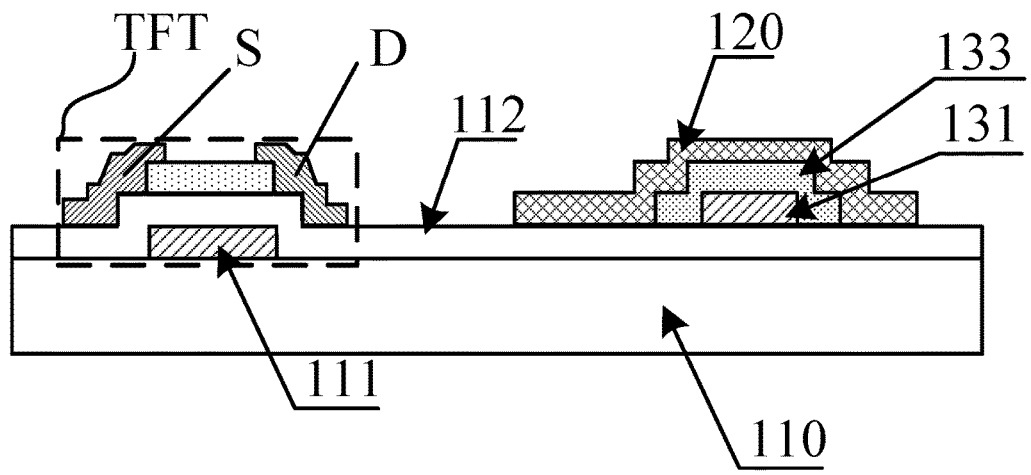
FIG. 4 is a diagram illustrating She structure of an array substrate in some embodiments.

FIG. 4 is a diagram illustrating the structure of an array substrate in some embodiments. Referring to FIG. 4, the array substrate in the embodiment includes a base substrate 110, and a thin film transistor TFT on the base substrate 110. The thin film transistor TFT includes a gate electrode 111 on the base substrate, a gate insulating layer 112 on a side of the gate electrode 111 distal to the base substrate 110, a source electrode S and a drain electrode D on a side of the gate insulating layer 112 distal to the base substrate 110. The array substrate in the embodiment further includes a first electrode 131 on a side of the gate insulating layer 112 distal to the base substrate 110, and an electrolyte layer 133 on a side of the first electrode 131 distal to the base substrate 110. The electrolyte layer 133 covers the entire surface of the first electrode 131, preventing any contact between the first electrode 131 and the second electrode. In additional to the storage capacitance formed by the top surface of the first electrode 131, additional capacitance are generated between the side surfaces of the first electrode 131 and the second electrode.

Many alternative embodiments that prevent contact between the first electrode and the second electrode can be practiced. For example, the array substrate may optionally include a protective layer, an electrolyte layer in a same layer as the protective layer, and a second electrode on the electrolyte layer. Optionally, the electrolyte layer is a polymer electrolyte layer.

Referring to FIG. 4, the array substrate in the embodiment further includes a pixel electrode 120. The pixel electrode 120 in the embodiment is used as the second electrode for the storage capacitor. For example, the pixel electrode 120 and the second electrode may be integrally formed as a single body. Optionally, the pixel electrode 120 and the second electrode may be formed in a single process.

Manufacturing process can be much simplified by forming the first electrode and the gate electrode in a single process, and by integrally forming the pixel electrode and the second electrode as a single body. The supercapacitor has a much larger capacitance as compared to a conventional capacitor. By using a supercapacitor in the array substrate, a same storage capacitance can be achieved using a smaller capacitor area as compared to a conventional capacitor. Accordingly, minimized feed-through voltage effects and an increased aperture ratio may be both achieved using an array substrate described herein.

Figure 5:
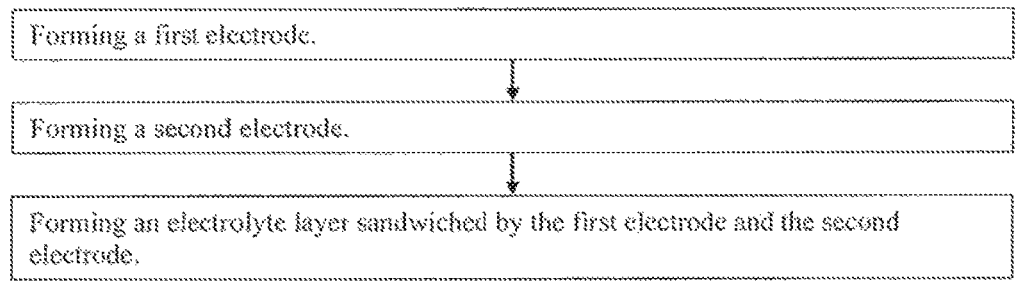
FIG. 5 is a flow chart illustrating a method of manufacturing an array substrate in some embodiments.

FIG. 5 is a flow chart illustrating a method of manufacturing an array substrate in some embodiments. Referring to FIG. 5, the method in the embodiment includes forming a storage capacitor on a base substrate. Specifically, the method includes forming a first electrode; forming a second electrode; and forming an electrolyte layer sandwiched by the first electrode and the second electrode.

By using a supercapacitor in the array substrate, a same storage capacitance can be achieved using a smaller capacitor area as compared to a conventional capacitor. Similarly, a much larger capacitance can be obtained by using an electrode area substantially the same as that of a conventional capacitor. Thus, the present disclosure provides a method of manufacturing an array substrate having minimized feed-through voltage effects without compromising aperture ratio of the array substrate.

Figure 6:
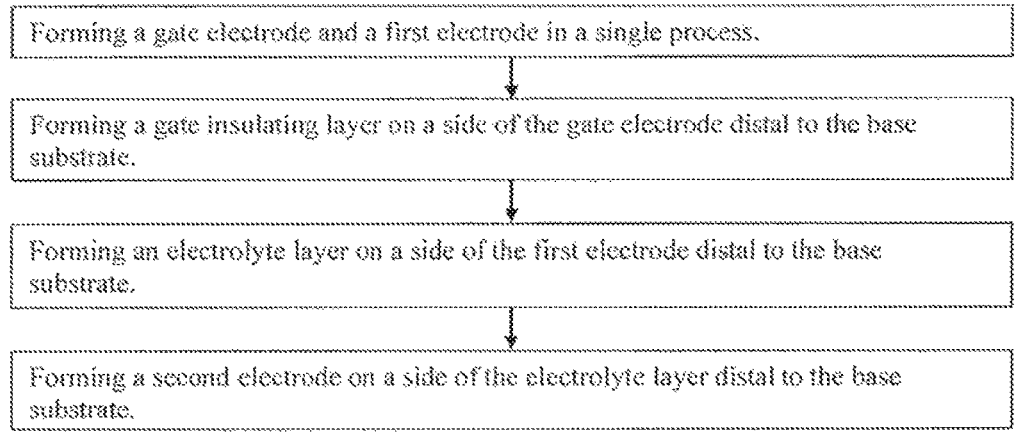
FIG. 6 is a flow chart illustrating a method of manufacturing an array substrate in some embodiments.

FIG. 6 is a flow chart illustrating a method of manufacturing an array substrate in some embodiments. Referring to FIG. 6, the method in the embodiment includes forming a gate electrode and a first electrode in a single process, forming a gale insulating layer on a side of the gate electrode distal to the base substrate, forming an electrolyte layer on a side of the first electrode distal to the base substrate, and forming a second electrode on a side of the electrolyte layer distal to the base substrate. Optionally, the gate insulating layer is formed in a same layer as the electrolyte layer. Optionally, the method in the embodiment further includes forming a pixel electrode on the base substrate, and connecting the pixel electrode to the second electrode.

By using a supercapacitor in the array substrate, a same storage capacitance can be achieved using a smaller capacitor area as compared to a conventional capacitor. Similarly, a much larger capacitance can be obtained by using an electrode area substantially the same as that of a conventional capacitor. Accordingly, the present disclosure provides a method of manufacturing an array substrate having minimized feed-through voltage effects without compromising aperture ratio of the array substrate.

Figure 7:
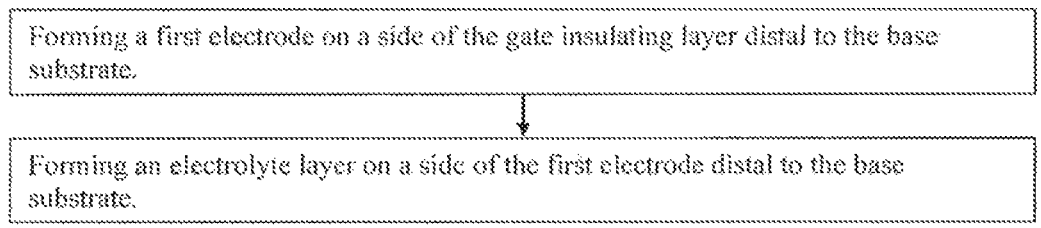
FIG. 7 is a flow chart illustrating a method of manufacturing an array substrate in some embodiments.

FIG. 7 is a flow chart illustrating a method of manufacturing an array substrate in some embodiments. Referring to FIG. 7, the method in the embodiment includes forming a first electrode on a side of the gate insulating layer distal to the base substrate, forming an electrolyte layer on a side of the first electrode distal to the base substrate. Optionally, the electrolyte layer is so formed that it covers the entire surface of the first electrode, preventing any contact between the first electrode and the second electrode. Many alternative embodiments that prevent contact between the first electrode and the second electrode can be practiced. For example, a protective layer may be formed on a base substrate, followed by forming an electrolyte layer in a same foyer as the protective layer, and forming a second electrode on the electrolyte layer.

Optionally, the electrolyte layer is a polymer electrolyte layer such as a gel-type polymer electrolyte layer or an all-solid-state polymer electrolyte layer. Examples of gel-type polymers for making the electrolyte layer include, but are not limited to, polyethylene glycol, potassium polyacrylate, and polyvinyl alcohol. Examples of ail-solid-state polymers for making the electrolyte layer include, but are not limited to, polyethylene oxide, polyvinylidene fluoride, and polyacrylonitrile.

Optionally, the method further includes forming a second electrode on a side of the electrolyte layer distal to the base substrate. Optionally, the second electrode is a pixel electrode formed on the base substrate.

The first electrode and the second electrode may be made of a same material or different materials. Optionally, the first electrode 131 and/or the second electrode 132 is made of one or more materials selected from a group consisting of carbon materials, metal oxides, and conductive polymers. Examples of carbon materials include, but are not limited to, carbon nanotubes, active carbon, and graphene. Examples of metal oxides include, but are not limited to, manganese dioxide, ruthenium dioxide, nickel cobalt oxide, and nickel cobalt hydroxide. Examples of conductive polymer include, but are not limited to, polyaniline, polythiophene, and polypyrrole.

By using a supercapacitor in the array substrate, a same storage capacitance can be achieved using a smaller capacitor area as compared to a conventional capacitor. Similarly, a much larger capacitance can be obtained by using an electrode area substantially the same as that of a conventional capacitor. Accordingly, the present disclosure provides a method of manufacturing an array substrate having minimized feed-through voltage effects without compromising aperture ratio of the array substrate.

The present disclosure also provides a display device having an array substrate described herein, or an array substrate manufactured by a method described herein.

The foregoing description of the embodiments of the invention has been prevented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention by defined by the claims appended hereto and their equivalents in which all terms are meant in their broadest reasonable sense unless otherwise indicated. Therefore, the term "the invention", "the present invention" or the like does not necessarily limit the claim scope to a specific embodiment and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention, it should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
a thin film transistor for driving image display in the array substrate and comprising a gate electrode, a gate insulating layer, a source electrode, and a drain electrode respectively on a base substrate of the array substrate;
a pixel electrode on the base substrate; and
a storage capacitor comprising a first electrode, a second electrode, and an electrolyte layer sandwiched by the first electrode and the second electrode, the electrolyte layer being in direct contact with the first electrode and in direct contact with the second electrode;
wherein
the gate insulating layer is in direct physical contact with the gate electrode;
a sidewall of the gate insulating layer directly contacts outermost sidewalls of the first electrode and the electrolyte layer respectively, and is aligned with an outermost sidewall of the second electrode;
the storage capacitor is an electrochemical capacitor; and
the electrolyte layer is a layer distinct from the gate insulating layer and comprises a material different from a material of the gate insulating layer.

2. The array substrate of claim 1, wherein the gate electrode is in a same layer as the first electrode.

3. The array substrate of claim 1, wherein the array substrate comprises a via extending through the gate insulating layer; and
the electrolyte layer extends through the via and in contact with the first electrode.

4. The array substrate of claim 1, wherein the pixel electrode is electrically connected to the second electrode.

5. The array substrate of claim 1, wherein the electrolyte layer is a polymer electrolyte layer.

6. The array substrate of claim 1, wherein the first electrode is made of one or more materials selected from a group consisting of carbon materials, metal oxides, and conductive polymers.

7. The array substrate of claim 1, wherein the second electrode is made of one or more materials selected from a group consisting of carbon materials, metal oxides, and conductive polymers.

8. A method of manufacturing an array substrate, comprising:
forming a thin film transistor for driving image display in the array substrate, the thin film transistor formed to comprise a gate electrode, a gate insulating layer, a source electrode, and a drain electrode respectively on a base substrate;
forming a pixel electrode on the base substrate;
forming a storage capacitor on the base substrate, the storage capacitor formed to comprise a first electrode, a second electrode, and an electrolyte layer sandwiched by the first electrode and the second electrode, the electrolyte layer formed to be in direct contact with the first electrode and in direct contact with the second electrode;
wherein
the gate insulating layer is formed to be in direct physical contact with the gate electrode;
a sidewall of the gate insulating layer directly contacts outermost sidewalls of the first electrode and the electrolyte layer respectively, and is aligned with an outermost sidewall of the second electrode;
the storage capacitor is an electrochemical capacitor; and the electrolyte layer is formed as a layer distinct from the gate insulating layer and comprises a material different from a material of the gate insulating layer.

9. The method of claim 8, wherein the gate electrode and the first electrode are formed in a single process.

10. The method of claim 8, further comprising forming a via extending through the gate insulating layer;
wherein the electrolyte layer is formed to extend through the via to be in contact with the first electrode.

11. A display apparatus comprising:
an array substrate, the array substrate comprising:
a thin film transistor for driving image display in the array substrate and comprising a gate electrode, a gate insulating layer, a source electrode, and a drain electrode respectively on a base substrate of the array substrate;
a pixel electrode on the base substrate; and
a storage capacitor comprising a first electrode, a second electrode, and an electrolyte layer sandwiched by the first electrode and the second electrode, the electrolyte layer being in direct contact with the first electrode and in direct contact with the second electrode;
wherein
the gate insulating layer is in direct physical contact with the gate electrode;
a sidewall of the gate insulating layer directly contacts outermost sidewalls of the first electrode and the electrolyte layer respectively, and is aligned with an outermost sidewall of the second electrode;
the storage capacitor is an electrochemical capacitor; and
the electrolyte layer is a layer distinct from the gate insulating layer and comprises a material different from a material of the gate insulating layer;
a counter substrate facing the array substrate, and
a liquid crystal layer between the array substrate and the counter substrate.

12. The array substrate of claim 1, wherein the electrolyte layer has a thickness in a range of 2 nm to 5000 nm.

13. The method of claim 8, wherein the electrolyte layer is formed to have a thickness in a range of 2 nm to 5000 nm.

14. The array substrate of claim 1, wherein the first electrode is distinct from a gate line.

15. The method of claim 8, wherein the first electrode is distinct from a gate line.

* * * * *